(12) United States Patent
Weber et al.

(10) Patent No.: US 11,588,288 B2
(45) Date of Patent: Feb. 21, 2023

(54) METHOD AND SYSTEM FOR FORMING AN ADAPTER FOR AN ELECTRICAL CONNECTOR FOR A VEHICLE USING A 3D PRINTER

(71) Applicant: WIRETRONIC AB, Vänersborg (SE)

(72) Inventors: Christoffer Weber, Vänersborg (SE); Sören Karlsson, Vänersborg (SE)

(73) Assignee: WIRETRONIC AB, Vänersborg (SE)

( * ) Notice: Subject to any disclaimer, the term of this patent is extended or adjusted under 35 U.S.C. 154(b) by 271 days.

(21) Appl. No.: 16/644,671

(22) PCT Filed: Sep. 13, 2018

(86) PCT No.: PCT/SE2018/050926
§ 371 (c)(1),
(2) Date: Mar. 5, 2020

(87) PCT Pub. No.: WO2019/054926
PCT Pub. Date: Mar. 21, 2019

(65) Prior Publication Data
US 2021/0111528 A1 Apr. 15, 2021

(30) Foreign Application Priority Data
Sep. 13, 2017 (SE) .................... 1751110-6

(51) Int. Cl.
*G05B 19/4099* (2006.01)
*H01R 43/18* (2006.01)
(Continued)

(52) U.S. Cl.
CPC .......... *H01R 43/18* (2013.01); *B29C 64/386* (2017.08); *B33Y 10/00* (2014.12); *B33Y 50/00* (2014.12);
(Continued)

(58) Field of Classification Search
CPC ... B29C 64/386; B29L 2031/36; B33Y 10/00; B33Y 50/00; B33Y 80/00; G01R 31/007;
(Continued)

(56) References Cited

U.S. PATENT DOCUMENTS

| 2014/0039662 A1* | 2/2014 | Boyer | B33Y 50/02 700/118 |
| 2014/0290049 A1* | 10/2014 | Lussier | G06F 30/17 29/745 |
| 2015/0283763 A1 | 10/2015 | Chi et al. | |

FOREIGN PATENT DOCUMENTS

| CN | 201813047 U | * | 4/2011 |
| CN | 201813047 U | | 4/2011 |
| CN | 106600689 A | | 4/2017 |

OTHER PUBLICATIONS

"Gen Coupe 3.8 BK1 and BK2 3D Printed Harness Connectors (Part 1)", video (retrieved from Internet on Mar. 13, 2018); https://www.youtube.com/watch?v=ImBPJpdAK5o [published Nov. 10, 2016], 1 page.
(Continued)

*Primary Examiner* — Yuhui R Pan
(74) *Attorney, Agent, or Firm* — RMCK Law Group, PLC

(57) ABSTRACT

The present disclosure generally relates to a novel concept of forming an adapter for an automotive application to be used for connecting a breakout box in-between an electrical control unit (ECU) of a vehicle and an electrical wiring system comprised with the vehicle. The adapter is formed using a 3D printer based on a construction of an electrical connector design provided with the ECU. The present disclosure also relates to a corresponding system and a computer program product.

12 Claims, 3 Drawing Sheets

(51) Int. Cl.
   *B33Y 10/00*      (2015.01)
   *B33Y 50/00*      (2015.01)
   *B33Y 80/00*      (2015.01)
   *B29C 64/386*     (2017.01)
   *G06T 7/00*       (2017.01)
   *H01R 43/20*      (2006.01)
   *B29L 31/36*      (2006.01)

(52) U.S. Cl.
   CPC .......... *B33Y 80/00* (2014.12); *G05B 19/4099* (2013.01); *G06T 7/0004* (2013.01); *H01R 43/20* (2013.01); B29L 2031/36 (2013.01); G05B 2219/35134 (2013.01); G05B 2219/49023 (2013.01); G06T 2207/10016 (2013.01); G06T 2207/30108 (2013.01); H01R 2201/26 (2013.01)

(58) Field of Classification Search
   CPC ...... G05B 19/4099; G05B 2219/35134; G05B 2219/49023; G06T 2207/10016; G06T 2207/30108; G06T 7/0004; H01R 2201/26; H01R 43/18; H01R 43/20; H01R 43/26
   See application file for complete search history.

(56) References Cited

OTHER PUBLICATIONS

"Gen Coupe 3.8 BK1 and BK2 3D Printed Harness Connectors (Part 2)", video (retrieved from Internet on Mar. 13, 2018); https://www.youtube.com/watch?v=1dL9GPP2hmY [published Nov. 10, 2016], 1 page.

Greenberg, A., "These 3-D Printed Skeleton Keys Can Pick High-Security Locks In Seconds," Article in Wired, Aug. 2014 [published online Aug. 26, 2014]; https://wired.com/2014/08/3d-printed-bump-keys/, 8 pages.

Medeiros, A et al., "Dual joints for 3D-structures," Vis Comput (2014), 30:1321-1331.

PCT International Search Report and Written Opinion dated Nov. 9, 2018 for International Application No. PCT/SE2018/050926, 13 pages.

Swedish Search Report dated Mar. 16, 2018 for Swedish Application No. 1751110-6, 3 pages.

Volvo Trucks Service Bulletin 284-04, "Engine ECU, FaultTracing, Checklist M, D12D," publication nr PV776-20 020418, Dec. 2004, https://volvotrucks.vg-emedia.com/ProductDetail.aspx?ProductId=492, 14 pages.

Extended European Search Report dated Apr. 8, 2021 for EP Application No. 18855515.5, 37 pages.

* cited by examiner

METHOD AND SYSTEM FOR FORMING AN ADAPTER FOR AN ELECTRICAL CONNECTOR FOR A VEHICLE USING A 3D PRINTER

CROSS-REFERENCE TO RELATED APPLICATIONS

This application is a 371 U.S. National Stage of International Application No. PCT/SE2018/050926, filed Sep. 13, 2018, which claims priority to Swedish Patent Application No. 1751110-6, filed Sep. 13, 2017. The disclosures of each of the above applications are incorporated herein by reference in their entirety.

TECHNICAL FIELD

The present disclosure generally relates to a novel concept of forming an adapter for an automotive application to be used for connecting a breakout box in-between an electrical control unit (ECU) of a vehicle and an electrical wiring system comprised with the vehicle. The adapter is formed using a 3D printer based on a construction of an electrical connector design provided with the ECU. The present disclosure also relates to a corresponding system and a computer program product.

BACKGROUND

Recent advances in computers and communications have had impact on how to control and operate a general vehicle. As a consequence, increasingly sophisticated processor based tools may be found throughout auto body and auto maintenance facilities for performing e.g. diagnosis work in relation to the vehicle. More and more of those devices communicate data back and forth with other similar devices and/or with host computers and various remote terminals.

For facilitating external computing equipment to be connected the vehicle is may be desirable to allow a so-called breakout cable or box to be connected to and possible in between an electrical control unit (ECU) of the vehicle and an electrical wiring system comprised with the vehicle. The breakout box is preferably adapted to allow for measurement and diagnosis to take place while the breakout box is connected, while maintaining the ECU connected to the equipment under test, etc. Thus, it is typically desirable to connect the breakout box directly to an electrical connector provided with the ECU.

With the constant development within the automotive industry and an ever increasing interest in miniaturization, new and even more advanced electrical connector are continuously developed, e.g. for different vehicle models and from different manufactures. Consequently, it will be almost impossible to provide electrical connectors taking into account the above while at the same time matching electrical connector of the ECU.

Accordingly, there seems to be room for means to simplify the presently tricky problem of allowing a breakout box to be swiftly connected in-between the ECU and the electrical wiring system comprised with the vehicle.

SUMMARY

According to an aspect of the present disclosure, it is therefore provided a method for forming an adapter for an electrical jack connector mounted at an electrical control unit (ECU) arrangement comprised with a vehicle, wherein the adapter is provided for allowing electrical connection to a breakout box, comprising the steps of receiving information relating to the electrical jack connector, wherein the electrical jack connector has a first gender, analyzing the received information for determining connector features of the electrical jack connector, generating a three dimensional (3D) model of the adapter based on a result of the analysis of the electrical jack connector, wherein the adapter is arranged as a corresponding electrical plug connector having the first gender, and forming, based on the 3D model, the adapter using a 3D printer.

The present disclosure is based upon the realization that connection of an electrical breakout box to an electrical system of a vehicle typically may be somewhat complicated, specifically since it is desirable that the connection may be made without affecting/destroying the already available connection between the ECU and the electrical system of the vehicle. Typically, the already available connection between the ECU and the electrical system of the vehicle includes an electrical jack connector (fixed socket connector), and having a first gender, mounted at e.g. a printed circuit board (PCB) of the ECU. The connection further comprises an electric plug connector, having a second gender, arranged at a wire bundle comprised with the electrical system of the vehicle (removable plug connector). The plug connector is adapted to be releasably connected to the jack connector.

The present disclosure provides an adapter for an automotive application to be fitted "in between" the plug connector provided at the wire bundle and the jack connector of the ECU, where the (formed) adapter is arranged to comprise an electrical plug connector having the first gender, thus making it connectable to the plug connector provided at the wire bundle. The adapter comprising the electrical plug connector is formed using a 3D printer based on an automated analysis and determination of connector features of the jack connector of the ECU. By the dynamic implementation as is made possible by combining (1) a direct analysis of the connector features of the jack connector and the following (2) formation of the adapter using a 3D printer, it is made possible to swiftly connect the breakout box in between the ECU and the electrical system of the vehicle, without having to mechanically e.g. mechanically interact/destroy the wire bundle and/or the plug connector provided at the wire bundle and the jack connector of the ECU.

In addition, by means of the present disclosure it is possible to drastically reduce the time need for connecting the breakout box in between a previously unknown/unused interface between the ECU and the electrical system of the vehicle, since the adapted possibly may be made e.g. "on-site" (such as at a workshop) based on the analysis of the jack connector provided at the ECU and the following 3D printing process, for example using a plastic material. It should of course be understood that the present disclosure is not limited in to a specific location for performing the inventive process. Rather, some or all parts of the process may be performed remotely from where the adapter is to be used.

In line with the present disclosure, it should be understood that the expression "electrical jack connector" relates to a fixed connector typically mounted at a PCB or similar (forming socket). Conversely, the expression "electrical plug connector" is a defines as a connector typically connected to e.g. a wire bundle comprising a plurality of wires (forming a plug), where the electrical plug connector typically is releasably connected to the electrical jack connector.

In a possible embodiment of the present disclosure, the step of generating the 3D model of the adapter comprises forming a plurality of contact cavities with the 3D model for inserting of a plurality of electrical contacts with the adapter. That is, it may in accordance to this embodiment be possible to allow for separately insertable electrical contacts to be provided/arranged and within the cavities. The electrical contacts may in turn be connected to a plurality of wires.

Furthermore, it may be advantageous to connect the plurality of electrical wires to an electrical plug connector having a second gender, the electrical plug connector adapted to be connected to the electrical jack connector mounted at the ECU arrangement, and the second gender being different from the first gender. The electrical wires may alternatively or also be connected to the breakout box. Accordingly, the adapter will allow a for a "three-way connection", where the breakout box is allowed to "listen in" on the communication between the ECU and the electrical system of the vehicle. Such communication may for example include commands sent to and received from the ECU. The commands sent may in turn be used for controlling electrical vehicle components connected throughout the electrical system of the vehicle. Such electrical vehicle components may possibly include further ECUs.

In a possible embodiment of the present disclosure the first gender is female. Accordingly, in such an embodiment the second gender is male. In conjunction with the above discussion, the electrical jack connector mounted at the ECU would thus be female and the electrical plug connector comprised with the 3D printed adapter would also be female. The adapter may in such an embodiment additionally comprise a male electrical plug connector for connection with the female electrical jack connector mounted at the ECU.

In accordance to the present disclosure, the connector features may advantageously comprise at least one of pin-out and mating dimensions of the electrical jack connector mounted at the ECU arrangement. The connector features may possibly be derived from an image or a video sequence of the electrical jack connector mounted at ECU, for example based on image analysis (image processing). The generation of the 3D model may thus typically be based on the connector features, however adapted in the opposite gender as compared to the gender (e.g. female) of the electrical jack connector mounted at ECU.

According to an aspect of the present disclosure, there is further provided a computer system for forming an adapter for an electrical jack connector mounted at an electrical control unit (ECU) arrangement comprised with a vehicle, wherein the adapter is provided for allowing electrical connection to a breakout box, wherein the system comprises a processing unit and a 3D printer, wherein the computer system is adapted to receive, using the processing unit, information relating to the electrical jack connector, wherein the electrical jack connector has a first gender, analyze, using the processing unit, the received information for determining connector features of the electrical jack connector, generate, using the processing unit, a three dimensional (3D) model of the adapter based on a result of the analysis of the electrical jack connector, wherein the adapter is arranged as a corresponding electrical plug connector having the first gender, and form, based on the 3D model, the adapter using the 3D printer. This aspect of the present disclosure provides similar advantages as discussed above in relation to the previous aspects of the present disclosure.

According to a further aspect of the present disclosure, there is provided a computer program product comprising a non-transitory computer readable medium having stored thereon computer program means for controlling a computer system adapted for forming an adapter for an electrical jack connector mounted at an electrical control unit (ECU) arrangement comprised with a vehicle, wherein the adapter is provided for allowing electrical connection to a breakout box, wherein the system comprises a processing unit and a 3D printer, wherein the computer program product comprises code for receiving information relating to the electrical jack connector, wherein the electrical jack connector has a first gender, code for analyzing the received information for determining connector features of the electrical jack connector, code for generating a three dimensional (3D) model of the adapter based on a result of the analysis of the electrical jack connector, wherein the adapter is arranged as a corresponding electrical plug connector having the first gender, and code for forming, based on the 3D model, the adapter using a 3D printer. Also this aspect of the present disclosure provides similar advantages as discussed above in relation to the previous aspects of the present disclosure.

A software executed by the server for operation in accordance to the present disclosure may be stored on a computer readable medium, being any type of memory device, including one of a removable nonvolatile random access memory, a hard disk drive, a floppy disk, a CD-ROM, a DVD-ROM, a USB memory, an SD memory card, or a similar computer readable medium known in the art.

In summary, the present disclosure generally relates to a novel concept of forming an adapter to be used for connecting a breakout box in-between an electrical control unit (ECU) of a vehicle and an electrical wiring system comprised with the vehicle. The adapter is formed using a 3D printer based on a construction of an electrical connector design provided with the ECU. The present disclosure also relates to a corresponding system and a computer program product.

Further features of, and advantages with, the present disclosure will become apparent when studying the appended claims and the following description. The skilled addressee realize that different features of the present disclosure may be combined to create embodiments other than those described in the following, without departing from the scope of the present disclosure.

BRIEF DESCRIPTION OF THE DRAWINGS

The various aspects of the present disclosure, including its particular features and advantages, will be readily understood from the following detailed description and the accompanying drawings, in which.

DETAILED DESCRIPTION

Figure 1:
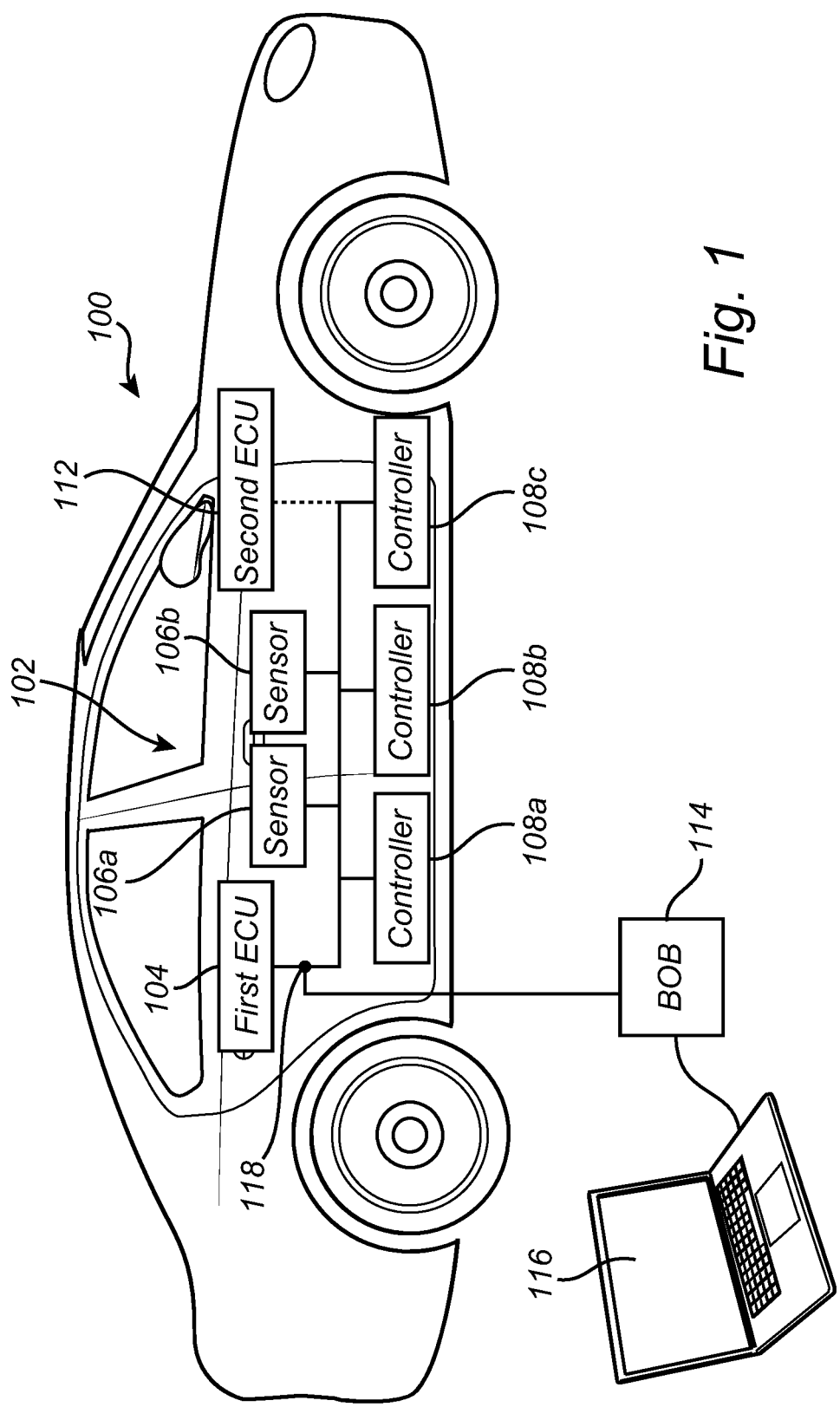
FIG. 1 conceptually illustrates an electrical system of a vehicle.

The present disclosure will now be described more fully hereinafter with reference to the accompanying drawings, in which currently preferred embodiments of the present disclosure are shown. This present disclosure may, however, be embodied in many different forms and should not be construed as limited to the embodiments set forth herein; rather, these embodiments are provided for thoroughness and completeness, and fully convey the scope of the present disclosure to the skilled person. Like reference characters refer to like elements throughout.

Turning now to the drawings and to FIG. 1a in particular, there is conceptually and in a greatly simplified manner illustrated a vehicle 100 comprising an electrical system 102. The electrical system 102 comprises a first ECU arrangement 104 and a plurality of sensors 106a, 106b and a plurality of controllers 108a, 108b and 108c. The ECU arrangement 104, the sensors 106 and the controllers 108 are connected to each other using e.g. a data bus, such as a Controller Area Network (CAN) bus 110. An optional second ECU arrangement 112 may also be connected to the CAN bus 110 and comprised with the electrical system 102.

As indicated above, the first ECU arrangement 104 is adapted to send and receive commands from the sensors 106 and the controllers 108, as well as optionally from the second ECU 102, using the CAN bus 110. The sensor 106 may include any type of sensing equipment comprised with the vehicle 100. The controllers 108 may in turn comprise any type of vehicle equipment, such as for example but not solely controllers for actuators, motors, etc.

In line with the present disclosure, a breakout box 114 is preferably connected to the electrical system 102 for allowing e.g. testing and support of the electrical system 102, as is well known to the person skilled in the art. The breakout box 114 specifically serves to "break out" signals communicated within the electrical system 102, allowing e.g. in-depth analysis and troubleshooting of the electrical system 102. The breakout box 114 may in turn be connected to e.g. a computer 116, where processing power provided by the computer 116 may be used for performing e.g. the in-depth analysis.

In FIG. 1, a connection for the breakout box 114 to the electrical system 102 is achieved at connection point 118, forming a three-way connection between (1) the first ECU arrangement 104, (2) the breakout box 114 and (3) the sensors/controllers 106/108 connected to the CAN bus 110.

Figure 2:
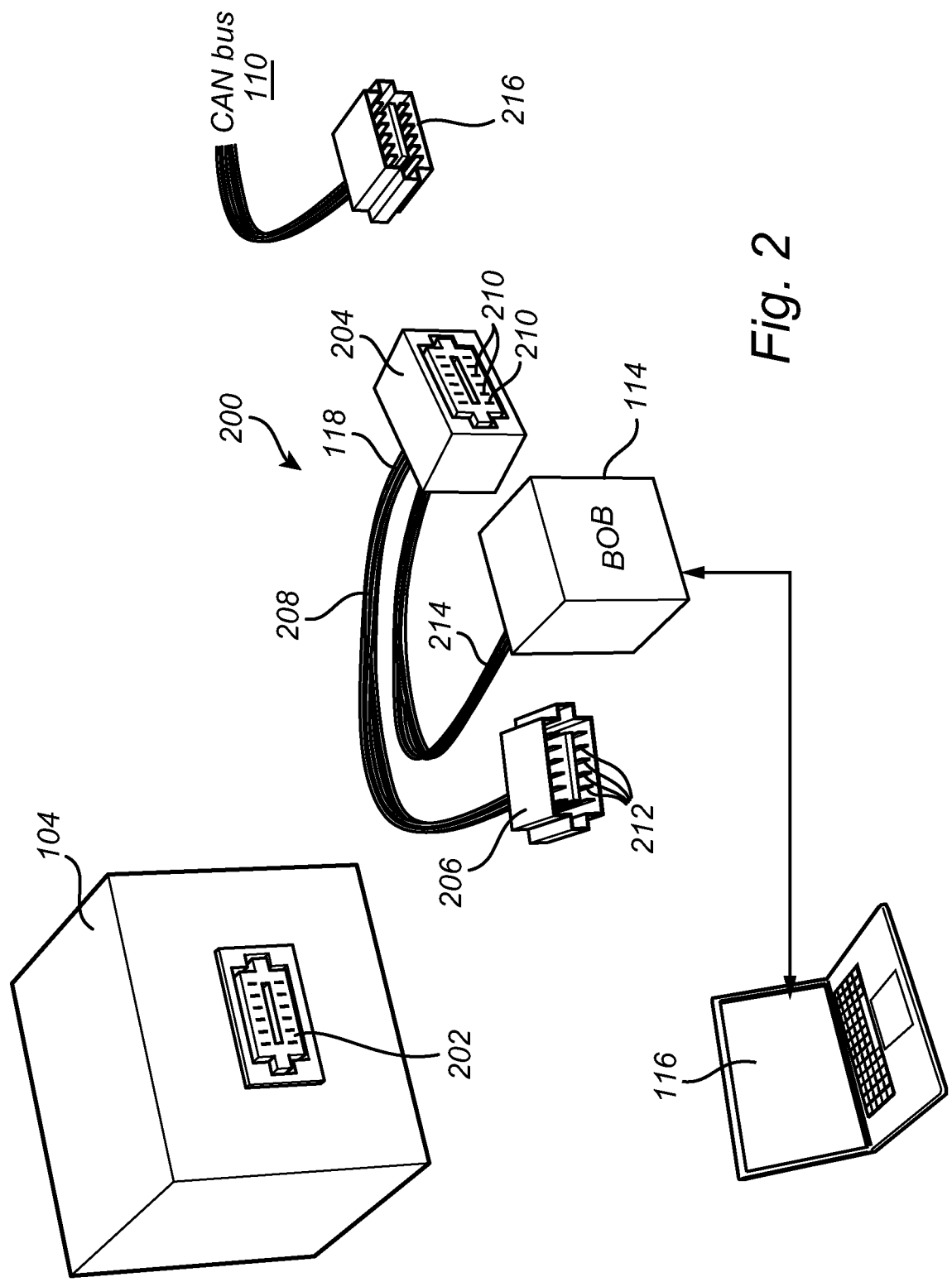
FIG. 2 provides an example of an adapter to be used with the electrical system and formed in accordance to a currently preferred embodiment of the present disclosure.

In FIG. 2 there is provided an example of an adapter 200 to be used for interfacing the breakout box 114 with the electrical system 102. FIG. 2 also partly illustrates the first ECU arrangement 104 and an electrical jack connector 202 mounted at the first ECU arrangement 104. In the illustrated embodiment the electrical jack connector 202 is a female connector.

The adapter 200 comprises an electrical plug connector 204 having the same gender as the electrical jack connector 202 of the first ECU arrangement 104. Thus, in this case the electrical plug connector 204 is a female connector. The electrical plug connector 204 is formed (in line with the concept according to the present disclosure) to have pin-out and mating dimensions provided in a manner corresponding to the same connector features of the electrical jack connector 202 of the first ECU arrangement 104.

The adapter 200 further comprises an electrical plug connector 206 having an opposite gender as compared to the electrical jack connector 202 of the first ECU arrangement 104, i.e. in this embodiment provided as a male connector. A wire bundle 208 comprising a plurality of electrical wires is provided for electrically connecting a plurality of electrical contacts (female) 210 of the electrical plug connector 204 with a corresponding plurality of (male) electrical contacts 212 comprised with the electrical plug connector 206. The adapter 200 further comprises means for providing the three-way connection point 118 as was illustrated in FIG. 1. In the illustrated embodiment as shown in FIG. 2 this is achieved by providing the adapter 200 with a further wire bundle 214 comprising a plurality of electrical wires. The plurality of wires, of the further wire bundle 214, are in one end connected (using a fixed or removable interface) to the electrical breakout box 114, in turn connected to the computer 116. The other end the plurality of wires, of the further wire bundle 214, are connected to the plurality of electrical contacts 210 of the electrical plug connector 204. In a preferred embodiment of the present disclosure, the electrical contacts 210 of the electrical plug connector 204 are thus adapted to receive two separate electrical wires coming from two separate wire bundles 208, 214.

During use of the adapter 200 in conjunction with the breakout box 114 and the electrical system 102 of the vehicle 100, an electrical (male) connector 216 of the electrical system 102 is initially connected to the electrical jack connector 202 of the first ECU arrangement 104. The electrical connector 216 is electrically disconnected from the electrical jack connector 202 mounted at the first ECU arrangement 104. The electrical plug connector 204 formed in a 3D printing process according to the present disclosure is then electrically connected to the electrical connector 216. The electrical plug connector 206 is in turn connected to the electrical jack connector 202 of the first ECU arrangement 104. Accordingly, the three-way connection point 118 is achieved allowing the breakout box 114 to be able to listen in on the communication over e.g. the CAN bus 110.

Once the testing/support procedure is finalized it is again possible to disconnect the adapter 200 and reconnect the electrical connector 216 with the electrical jack connector 202 of the first ECU arrangement 104, without having to mend a possibly broken electrical connector 216 or wire bundle.

Figure 3:
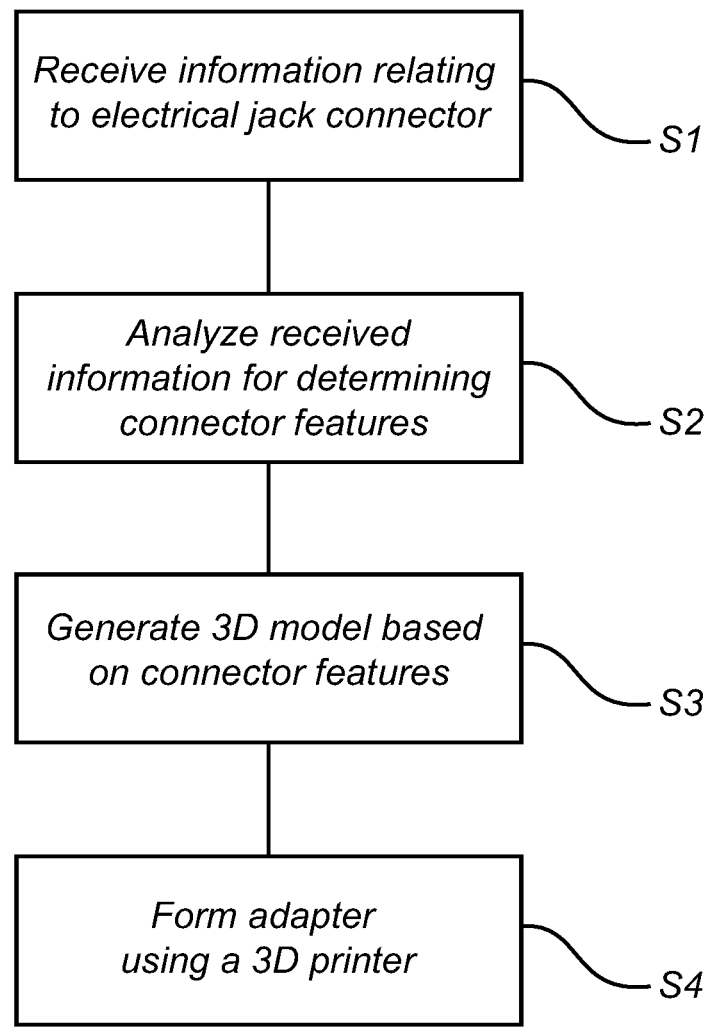
FIG. 3 is a flow chart illustrating the steps of forming the adapter provided in line with the concept of the present disclosure.

Turning now to FIG. 3 illustrating the steps of forming the adapter 200 provided in line with the concept of the present disclosure. The description below is provided with reference to the illustration provided in relation to FIG. 2, specifically in relation to the genders of the connectors. The process starts by e.g. a computer system (not shown) receiving, S1, information relating to the electrical jack connector 202 of the first ECU arrangement 104. Such information may for example include an image or video of the electrical jack connector 202, or a reference to a part number of the electrical jack connector 202.

The computer system subsequently analyzes, S2, the received information for determining connector features of the electrical jack connector 202. As discussed above, such connector features may for example include at least one of pin-out and mating dimensions of the electrical jack connector 202. This process may for example comprise performing image analysis of the captured/received image or video, or receiving corresponding information from e.g. a remotely arranged server in case of having the part number for the electrical jack connector 202.

Based on the resulting information, the computer system generates, S3, a 3D model for the adapter 200. This process further comprises forming a female electrical plug connector 204 having the same connector features as the electrical jack connector 202, specifically at the end/side of the electrical plug connector 204 at the "interface end" (i.e. where a further connector is to mate). However, the wire bundle end of the electrical plug connector 204 will be formed differently as compared to a "normal" plug connector. Specifically, the electrical plug connector 204 is adapted for allowing not only one but two wire bundles to be connected, one for the male electrical connector plug connector 206 (i.e. wire bundle 208) and one for connection with the breakout box 114 (i.e. wire bundle 214). Accordingly, the generation of the 3D model typically includes an adaptation step for allowing the formation of an electrical plug connector where (at least) the two wire bundles 208, 214 are allowed to be connected.

The generation of the 3D model further comprises forming a plurality of contact cavities with the 3D model for inserting of a plurality of electrical contacts 210. In line with the discussion above, the electrical contacts 210 are thus in accordance to the present disclosure adapted for receiving the wires of both of the wire bundles 208, 214.

Once the adapted 3D model has been formed, the 3D model is provided to a 3D printer where, typically but not exclusively a plastic based electrical plug connector 204 is formed, comprising the above mentioned contact cavities. The electrical contacts 210 may then be inserted into the cavities, either before or after connecting the wires of both of the wire bundles 208, 214 to each of the electrical contacts 210.

It should be understood that the 3D printer used for forming the adapter 200, comprising the electrical plug connector 204, may employ any type of suitable technique. It should further be understood that it could be possible, and within the scope of the present disclosure, to allow the 3D printing process to be a "mixed material" process, where e.g. a cover of the electrical plug connector 204 is made from plastic. The electrical contacts 210 may in turn be formed "within" the electrical plug connector 204, formed from a metal material.

The control functionality of the present disclosure may be implemented using existing computer processors, or by a special purpose computer processor for an appropriate system, incorporated for this or another purpose, or by a hardwire system. Embodiments within the scope of the present disclosure include program products comprising machine-readable medium for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures may show a sequence the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule-based logic and other logic to accomplish the various connection steps, processing steps, comparison steps and decision steps. Additionally, even though the present disclosure has been described with reference to specific exemplifying embodiments thereof, many different alterations, modifications and the like will become apparent for those skilled in the art.

In addition, variations to the disclosed embodiments can be understood and effected by the skilled addressee in practicing the claimed present disclosure, from a study of the drawings, the disclosure, and the appended claims. Furthermore, in the claims, the word "comprising" does not exclude other elements or steps, and the indefinite article "a" or "an" does not exclude a plurality.

The invention claimed is:

1. A method performed by a computer system for forming a three-way connection point adapter for an electrical jack connector mounted at an electrical control unit (ECU) arrangement comprised with a vehicle, wherein the adapter is provided for allowing a breakout box to be electrically connected between the ECU and an electrical system of the vehicle, the method comprising:

receiving, at the computer system, information relating to the electrical jack connector by acquiring, using a camera, an image or a video of the electrical jack connector mounted at the ECU, wherein the electrical jack connector has a first gender;

analyzing, by the computer system, the received information by performing image analysis of the image or video of the electrical jack connector mounted at the ECU for determining connector features of the electrical jack connector;

generating, by the computer system, a three dimensional (3D) model of the adapter based on a result of the image analysis of the electrical jack connector, wherein generating the 3D model comprises forming a plurality of contact cavities with the 3D model and wherein the adapter includes an electrical plug connector having: (i) the first gender, (ii) one or more plug features corresponding to one or more of the connector features of the electrical jack connector, and (iii) one or more additional plug features that allow at least two wire bundles to be connected to the electrical plug connector;

forming, by the computer system and based on the 3D model, the adapter using a 3D printer;

providing a plurality of electrical contacts adapted to be inserted in the plurality of contact cavities;

connecting the at least two wire bundles a plurality of cicctrical wires to the plurality of electrical contacts; and connecting one of the at least two wire bundles to the a second electrical plug connector having a second gender, the second electrical plug connector adapted to be connected to the electrical jack connector mounted at the ECU arrangement, and the second gender being different from the first gender, and connecting another one of the at least two wire bundles to the breakout box.

2. The method according to claim 1, wherein the first gender is female.

3. The method according to claim 1, wherein the second gender is male.

4. The method according to claim 1, wherein the connector features comprise at least one of pin-out and mating dimensions of the electrical jack connector mounted at the ECU arrangement.

5. The method according to claim 1, wherein the plurality of electrical contacts inserted in the plurality of contact cavities of the adapter are arranged to be connected to a first electrical wire bundle for the electrical plug connector having the second gender and a second electrical wire bundle for the breakout box.

6. The method according to claim 5, wherein each of the plurality of electrical contacts is connected to a single electrical wire of the first electrical wire bundle and a single wire of the second electrical wire bundle.

7. The method according to claim 1, wherein the adapter is formed in a plastic material.

8. A computer system for forming a three-way connection point adapter for an electrical jack connector mounted at an electrical control unit (ECU) arrangement comprised with a vehicle, wherein the adapter is provided for allowing a breakout box to be electrically connected between the ECU and an electrical system of the vehicle, wherein the system comprises a processing unit, a camera, and a 3D printer, wherein the computer system is adapted to:
  receive, using the processing unit, information relating to the electrical jack connector by acquiring, using the camera, an image or a video of the electrical jack connector mounted at the ECU, wherein the electrical jack connector has a first gender;
  analyze, using the processing unit, the received information by performing image analysis of the image or video of the electrical jack connector mounted at the ECU for determining connector features of the electrical jack connector;
  generate, using the processing unit, a three dimensional (3D) model of the adapter based on a result of the image analysis of the electrical jack connector, wherein generating the 3D model comprises forming a plurality of contact cavities with the 3D model and wherein the adapter includes an electrical plug connector having: (i) the first gender, (ii) one or more plug features corresponding to one or more of the connector features of the electrical jack connector, and (iii) one or more additional plug features that allow at least two wire bundles to be connected to the electrical plug connector;
  form, based on the 3D model, the adapter using the 3D printer;
  provide a plurality of electrical contacts adapted to be inserted in the plurality of contact cavities;
  wherein:
  connect the at least two wire bundles to the plurality of electrical contacts; and
  connect one of the at least two wire bundles to a second electrical plug connector having a second gender, the second electrical plug connector adapted to be connected to the electrical jack connector mounted at the ECU arrangement, and the second gender being different from the first gender, and
  connecting another one of the at least two wire bundles to the breakout box.

9. The computer system according to claim 8, wherein the first gender is female.

10. The computer system according to claim 8, wherein the second gender is male.

11. The computer system according to claim 8, wherein the connector features comprise at least one of pin-out and mating dimensions of the electrical jack connector mounted at the ECU arrangement.

12. The computer system according to claim 8, wherein the adapter is formed in a plastic material.

\* \* \* \* \*